(12) United States Patent
Sheth et al.

(10) Patent No.: US 12,039,156 B2
(45) Date of Patent: *Jul. 16, 2024

(54) METHODS AND SYSTEMS FOR DYNAMIC MONITORING THROUGH GRAPHICAL USER INTERFACES

(71) Applicant: Capital One Services, LLC, McLean, VA (US)

(72) Inventors: Seemit Sheth, Frisco, TX (US); Prashanta Saha, Bangalore (IN); Huey-Meng Ning, Plano, TX (US); Romit Dasgupta, Kolkata (IN); Joydeep Dasgupta, Bangalore (IN); Xinyu Chen, Bellaire, TX (US); Sandeep Komatireddy, Plano, TX (US)

(73) Assignee: Capital One Services, LLC, McLean, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,889

(22) Filed: Aug. 11, 2023

(65) Prior Publication Data
US 2023/0384920 A1 Nov. 30, 2023

Related U.S. Application Data

(63) Continuation of application No. 17/228,021, filed on Apr. 12, 2021, now Pat. No. 11,755,185, which is a (Continued)

(51) Int. Cl.
*G06F 3/04845* (2022.01)
*G06F 3/0482* (2013.01)
(Continued)

(52) U.S. Cl.
CPC ........ *G06F 3/04845* (2013.01); *G06F 3/0482* (2013.01); *G06F 30/20* (2020.01);
(Continued)

(58) Field of Classification Search
CPC .................................................. G06F 3/04845
(Continued)

(56) References Cited

U.S. PATENT DOCUMENTS 7,383,218 B1 * 6/2008 Oros ...................... G06Q 40/06
705/36 R
7,813,822 B1 * 10/2010 Hoffberg ................ H04N 7/163
381/73.1

(Continued)

*Primary Examiner* — Reza Nabi
(74) *Attorney, Agent, or Firm* — Perkins Coie LLP

(57) ABSTRACT

Methods and systems for monitoring through graphical user interfaces are disclosed. In one aspect, a system is disclosed that includes a processor and data storage including instructions that, when executed by the processor, cause the system to perform operations. The operations include maintaining an input file including predetermined criteria for a plurality of factors, receiving a model dataset generated using a model, based on the input file and the model dataset, generating a first graphical user interface that includes a graphical illustration of a subset of the plurality of factors, a model risk for the model, and a selectable feature associated with a selected factor in the subset and a selected time period. The operations further include receiving through the first graphical user interface a selection of the selectable feature, and, in response, generating a second graphical user interface that recolors a portion of the first graphical user interface.

20 Claims, 11 Drawing Sheets

Related U.S. Application Data continuation of application No. 16/781,255, filed on Feb. 4, 2020, now Pat. No. 11,003,341, which is a continuation of application No. 15/963,699, filed on Apr. 26, 2018, now Pat. No. 10,606,459.

(60) Provisional application No. 62/635,224, filed on Feb. 26, 2018.

(51) Int. Cl.
*G06F 30/20* (2020.01)
*G06T 11/00* (2006.01)
*G06T 11/20* (2006.01)
*H04L 67/1097* (2022.01)

(52) U.S. Cl.
CPC ........... *G06T 11/001* (2013.01); *G06T 11/203* (2013.01); *G06T 2200/24* (2013.01); *H04L 67/1097* (2013.01)

(58) Field of Classification Search
USPC ........................................................ 715/762
See application file for complete search history.

(56) References Cited

U.S. PATENT DOCUMENTS

| | | | | |
|---|---|---|---|---|
| 8,738,516 | B1* | 5/2014 | Dean | G06Q 40/02 705/40 |
| 9,569,797 | B1* | 2/2017 | Rohn | G06Q 40/03 |
| 9,671,776 | B1* | 6/2017 | Beard | G05B 19/41885 |
| 10,606,459 | B2* | 3/2020 | Sheth | G06F 30/20 |
| 10,643,276 | B1* | 5/2020 | Loddo | G06Q 40/03 |
| 11,562,457 | B2* | 1/2023 | Ramos | G06Q 30/0269 |
| 11,630,822 | B2* | 4/2023 | Helms | G06F 3/04847 707/769 |
| 2003/0046223 | A1* | 3/2003 | Crawford | G06Q 20/10 705/38 |
| 2007/0016542 | A1* | 1/2007 | Rosauer | G06Q 10/067 706/21 |
| 2007/0100724 | A1* | 5/2007 | Hollas | G06Q 40/00 705/36 R |
| 2007/0124236 | A1* | 5/2007 | Grichnik | G06Q 40/03 705/38 |
| 2009/0182593 | A1* | 7/2009 | Whitmore | G06Q 10/063 705/7.28 |
| 2011/0246385 | A1* | 10/2011 | Laxmanan | G06Q 10/067 703/2 |
| 2012/0066116 | A1* | 3/2012 | Kornegay | G06Q 20/102 705/38 |
| 2012/0317058 | A1* | 12/2012 | Abhulimen | G06N 20/00 706/2 |
| 2013/0332340 | A1* | 12/2013 | Papadimitriou | G06Q 40/02 705/38 |
| 2014/0074689 | A1* | 3/2014 | Lund | G06Q 40/03 705/38 |
| 2014/0164164 | A1* | 6/2014 | Rabenold | G06Q 30/08 705/26.3 |
| 2014/0279382 | A1* | 9/2014 | Drakeley | G06Q 20/108 705/38 |
| 2015/0006122 | A1* | 1/2015 | Du | G06F 30/20 703/2 |
| 2017/0018023 | A1* | 1/2017 | Roux | G06Q 30/0201 |
| 2017/0228820 | A1* | 8/2017 | Rohn | G06Q 40/03 |
| 2019/0265870 | A1* | 8/2019 | Sheth | G06T 11/001 |
| 2020/0125359 | A1* | 4/2020 | Bhardwaj | G06F 11/36 |
| 2020/0174647 | A1* | 6/2020 | Sheth | G06F 3/04845 |
| 2020/0327610 | A1* | 10/2020 | Rohn | G06Q 40/03 |
| 2020/0357063 | A1* | 11/2020 | Loddo | G06Q 40/03 |
| 2021/0073908 | A1* | 3/2021 | Swamy | G06Q 40/03 |
| 2021/0133632 | A1* | 5/2021 | Elprin | G06N 20/10 |
| 2021/0232297 | A1* | 7/2021 | Sheth | G06F 3/0482 |

* cited by examiner

METHODS AND SYSTEMS FOR DYNAMIC MONITORING THROUGH GRAPHICAL USER INTERFACES

CROSS-REFERENCE TO RELATED APPLICATIONS

This application is a continuation of U.S. patent application Ser. No. 17/228,021, filed Apr. 12, 2021, which is a continuation of U.S. patent application Ser. No. 16/781,255 filed Feb. 4, 2020, which is a continuation of U.S. patent application Ser. No. 15/963,699, filed Apr. 26, 2018, which claims priority under 35 U.S.C. § 119 to U.S. Provisional Patent Application No. 62/635,224, filed Feb. 26, 2018. The aforementioned applications are incorporated herein by reference in their entirety.

BACKGROUND

In some cases, models may be used to model one or more factors. For example, a model may be created using software that generates a modeled value for each factor. The collection of modeled values may be referred to as a model dataset.

Because models are imperfect, a modeled value for a factor may in some instances deviate from a value for that factor in reality. As a result, the model may similarly deviate from reality. Such deviation of the model may be referred to as "model drift." Model drift may pose a danger that the model will not accurately model reality. Danger associated with model drift may be referred to as "model risk." The extent to which a single factor and/or its associated modeled value contributes to the model risk may be referred to as a "factor risk."

In some instances, it may be desirable to dynamically isolate, identify, and illustrate factors that contribute to model drift and/or model risk. Existing technologies, however, which rely on static graphical user interfaces, do not provide such dynamic isolation, identification, and illustration of factors that contribute to model drift and/or model risk.

SUMMARY

The disclosed embodiments describe systems and methods for dynamic monitoring models through graphical user interfaces.

In one aspect, a system is disclosed that includes a processor and data storage including instructions that, when executed by the processor, cause the system to perform operations. The operations include maintaining an input file comprising predetermined criteria for a plurality of factors; receiving a model dataset generated using a model, the model dataset comprising modeled values for the factors; generating, based on the input file and the model dataset, a first graphical user interface comprising a graphical illustration of a subset of the factors, a model risk for the model, and a selectable feature associated with a selected factor in the subset and a selected time period; receiving, through the first graphical user interface, a selection of the selectable feature; and, in response to receiving the selection, generating a second graphical user interface, the second graphical user interface recoloring at least a portion of the first graphical user interface to highlight in the graphical illustration the selected factor during the selected time period and comprising indications of the predetermined criteria for the selected factor.

In another aspect, a system is disclosed that includes a processor and data storage including instructions that, when executed by the processor, cause the system to perform operations. The operations include receiving a model dataset generated for a model, the model dataset comprising modeled values for a plurality of factors; identifying, based on the model dataset, primary modeled values and secondary modeled values for the model and generating a first graphical user interface comprising a graphical illustration of a model risk for the model, indications of the primary modeled values and the secondary modeled values, and a first selectable feature associated with a selected primary modeled value; receiving through the first graphical user interface a selection of the first selectable feature; in response to receiving the selection of the first selectable feature, generating a second graphical user interface comprising a graphical illustration of the selected primary modeled value over a time period and a second selectable feature associated with a model drift for the model; receiving through the second graphical user interface a selection of the second selectable feature; and, in response to receiving the selection of the second selectable feature, generating a third graphical user interface that overlays the second graphical user interface with a graphical illustration of the model drift, the graphical illustration of the model drift illustrating an extent to which the selected primary modeled value contributes to the model drift relative to at least one other primary modeled value.

Aspects of the disclosed embodiments may include non-transitory, tangible computer-readable media that store software instructions that, when executed by one or more processors, are configured for and capable of performing and executing one or more of the methods, operations, and the like consistent with the disclosed embodiments. Also, aspects of the disclosed embodiments may be performed by one or more processors that are configured as special-purpose processor(s) based on software instructions that are programmed with logic and instructions that perform, when executed, one or more operations consistent with the disclosed embodiments.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate disclosed embodiments and, together with the description, serve to explain the disclosed embodiments. In the drawings.

DETAILED DESCRIPTION

Reference will now be made in detail to the disclosed embodiments, examples of which are illustrated in the accompanying drawings.

The disclosed systems, methods, and media describe systems and methods for dynamic monitoring through graphical user interfaces. In some embodiments, the graphical user interfaces may be used for dynamic monitoring of one or more models.

A dynamically monitored model may be, for example, a model generated by software, an application, and/or other instructions. In some embodiments, the model may take the form of and/or include a model dataset. The model data set may include, for example, modeled values for any number of factors.

The factors and the modeled values in the dataset may take any number of forms. For example, for a model modeling the mortgage industry, the factors may include home prices, housing volatility, mortgage payments, interest rates, demographics, and/or foreclosures. As another example, for a model modeling consumer credit, the factors may include credit scores, debt-to-income ratios, payment histories, defaults, and/or demographics. Other factors are possible as well. Modeled values may be any values generated by the model, based on the factors. For example, a modeled value for a factor may take the form of a single value and/or a value over time. As another example, a modeled value for a factor may take the form of a distribution or other statistical calculation associated with the factor, such as a performance or a population stability index for the factor. Other modeled values are possible as well. In general, the modeled values may be independent of one another or may be interdependent. In some embodiments, the model may consider multiple factors in modeling a factor to generate a modeled value.

Figure 1:
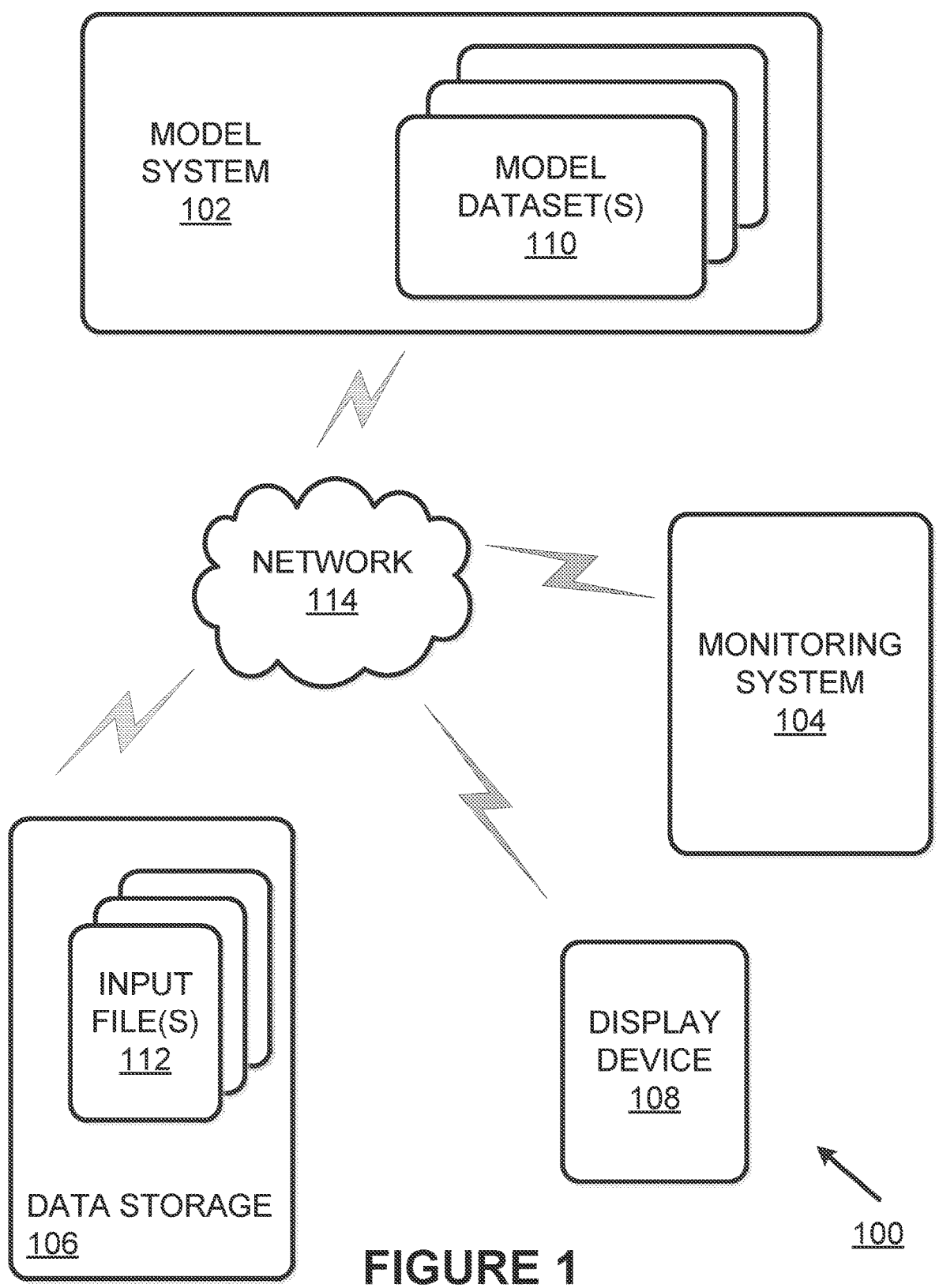
FIG. 1 is a block diagram of an exemplary system, consistent with disclosed embodiments.

FIG. 1 is a block diagram of an exemplary system 100, consistent with disclosed embodiments. System 100 may be configured for performing a dynamic monitoring process consistent with disclosed embodiments.

As shown, system 100 may include a model system 102, a monitoring system 104, data storage 106, and a display device 108, all of which may be communicatively coupled by a network 114. As shown, model system 102 may include one or more model dataset(s) 110, and data storage 106 may include one or more input file(s) 112. While only one model system 102, monitoring system 104, data storage 106, and display device 108 are shown, it will be understood that system 100 may include more than one model system 102, monitoring system 104, data storage 106 and/or display device 108 as well. Further, while certain numbers of model dataset(s) 110 and input file(s) 112 are shown, it will be understood that system 100 may include more or fewer of these components as well. More generally, the components and arrangement of the components included in system 100 may vary. Thus, system 100 may include other components that perform or assist in the performance of one or more processes consistent with the disclosed embodiments.

Model system 102 may be one or more computing devices configured to generate model dataset(s) 110. Each of model dataset(s) 110 may include modeled values for each of a number of factors. The factors and modeled values in a model dataset 110 may vary depending on the nature of the model. For example, for a model modeling mortgages, the factors may include factors associated with mortgages, such as interest rates, mortgage trade lines, public records, etc., and the modeled values may include values determined according to the model for each of the factors. As another example, for a model modeling automobile financing, the factors may include factors associated with automobile financing, such as pricing information, automobile makes and models, and/or depreciation information, and the modeled values may include values determined according to the model for each of the factors. The modeled values may be included in the model dataset 110. In some embodiments, the model dataset 110 may include the factors as well.

Once a model dataset 110 has been generated, model system 102 may provide the model dataset 110 to monitoring system 104. In some embodiments, model system 102 may maintain model dataset 110 in a data storage location accessible by monitoring system 104, such as in local data storage at model system 102 and/or in remote data storage, such as data storage 106. Alternatively or additionally, model system 102 may provide the model dataset 110 to monitoring system 104 over network 114 or another communication channel. For instance, model system 102 may provide the model dataset 110 through a "push" mechanism, upon request, and/or periodically.

In connection with the dynamic monitoring processes, monitoring system 104 may maintain one or more input file(s) 112. While the input file(s) 112 are shown to be stored in data storage 106, in some embodiments input file(s) 112 may alternatively or additionally be stored in local data storage at monitoring system 104 and/or in other remote data storage accessible over network 114. Monitoring system 104 may be one or more computing devices configured to carry out the dynamic monitoring processes described herein.

Input files 112 may include indications of predetermined criteria for the factors used by model system 102 to generate model dataset(s) 110. The predetermined criteria for a factor may take the form of and/or include, for example, a target value for the factor and/or a range of target values for the factor, a historical value for the factor and/or a range of historical values for the factor, a distribution of values for the factor, and/or one or more predetermined rules governing a relationship between the factor and the modeled value, such as a deviation between the factor and the modeled value and/or a factor risk associated with the deviation between the factor and the modeled value. Input files 112 may take other forms as well.

In connection with the dynamic monitoring processes, monitoring system 104 may additionally receive one or more model dataset(s) 110 from model system 102. In some embodiments, model system 102 may maintain model dataset 110 in a data storage location accessible by monitoring system 104, such as in local data storage at model system 102 and/or in remote data storage, such as data storage 106. Alternatively or additionally, model system 102 may provide the model dataset 110 to monitoring system 104 over network 114 or another communication channel. For instance, model system 102 may provide the model dataset 110 through a "push" mechanism, upon request, and/or periodically.

Based on model dataset 110 and input file 112, monitoring system 104 may generate one or more graphical user interfaces. The graphical user interfaces may be dynamic graphical user interfaces with which a user may interact to dynamically isolate, identify, and illustrate factors that contribute to model drift and/or model risk. The graphical user interfaces may include, for example, graphical and/or textual illustrations of one or more of the factors, the modeled values, and/or the model. Alternatively or additionally, the graphical user interfaces may include graphical and/or textual illustrations of information associated with the factors, modeled values, and/or model, such as factor risk, model risk, and/or model drift. Example graphical user interfaces are described below in connection with FIGS. 5A-5C and 7A-7C.

In some embodiments, graphical user interfaces generated by monitoring system 104 may be provided for display on, for example, a display device 108. Display device 108 may be any device configured to display graphical user interfaces, including but not limited to monitors, desktop computers, laptop computers, tablets, and other computing devices. Other display devices are possible as well.

Data storage 106 may include one or more computing devices configured to maintain information for use in the dynamic monitoring processes described herein. For example, as shown, data storage 106 may maintain input file(s) 112. In some embodiments, input file(s) 112 may be modifiable in data storage 106 by one or both of model system 102 and monitoring system 104. In some embodiments, data storage 106 may maintain other information as well, such as model dataset(s) 110 and/or other information.

In some embodiments, data storage 106 may take the form of one or more servers or databases, such as Oracle™ databases, Sybase™ databases, or other relational databases or non-relational databases, such as Hadoop sequence files, HBase, or Cassandra. Such database(s) may include computing components (e.g., database management system, database server, etc.) configured to receive and process requests for data stored in memory devices of the database (s) and to provide data from the database(s). Alternatively or additionally, data storage 106 may include cloud-based storage accessible by model system 102 and/or monitoring system 104 over network 114 and/or another network.

In some embodiments, data storage 106 may be configured to aggregate information from one or more sources, such as one or more servers in network 114 and/or system 100. Alternatively or additionally, data storage 106 may be included in and/or otherwise associated with one or more such sources. In some embodiments, data storage 106 may aggregate data from, may be included in, and/or may be otherwise associated with a financial service entity that provides, maintains, manages, or otherwise offers financial services. For example, the financial service entity may be a bank, credit card issuer, or any other type of financial service entity that generates, provides, manages, and/or maintains user accounts for customers. In some embodiments, user accounts may include, for example, credit card accounts, loan accounts, checking accounts, savings accounts, reward or loyalty program accounts, and/or any other type of financial service account. While data storage 106 is shown separately, in some embodiments data storage 106 may be included in and/or otherwise associated with model system 102, monitoring system 104, and/or another entity in network 114 and/or system 100.

Network 114 may be any type of network configured to provide communication between components of system 100. For example, network 114 may be any type of network (including infrastructure) that provides communications, exchanges information, and/or facilitates the exchange of information, such as the Internet, a Local Area Network, near field communication (NFC), or other suitable connection(s) that enables the sending and receiving of information between the components of system 100. In other embodiments, one or more components of system 100 may communicate directly through a dedicated communication link (s).

It is to be understood that the configuration and boundaries of the functional building blocks of system 100 have been defined herein for the convenience of the description. Alternative boundaries may be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Figure 2:
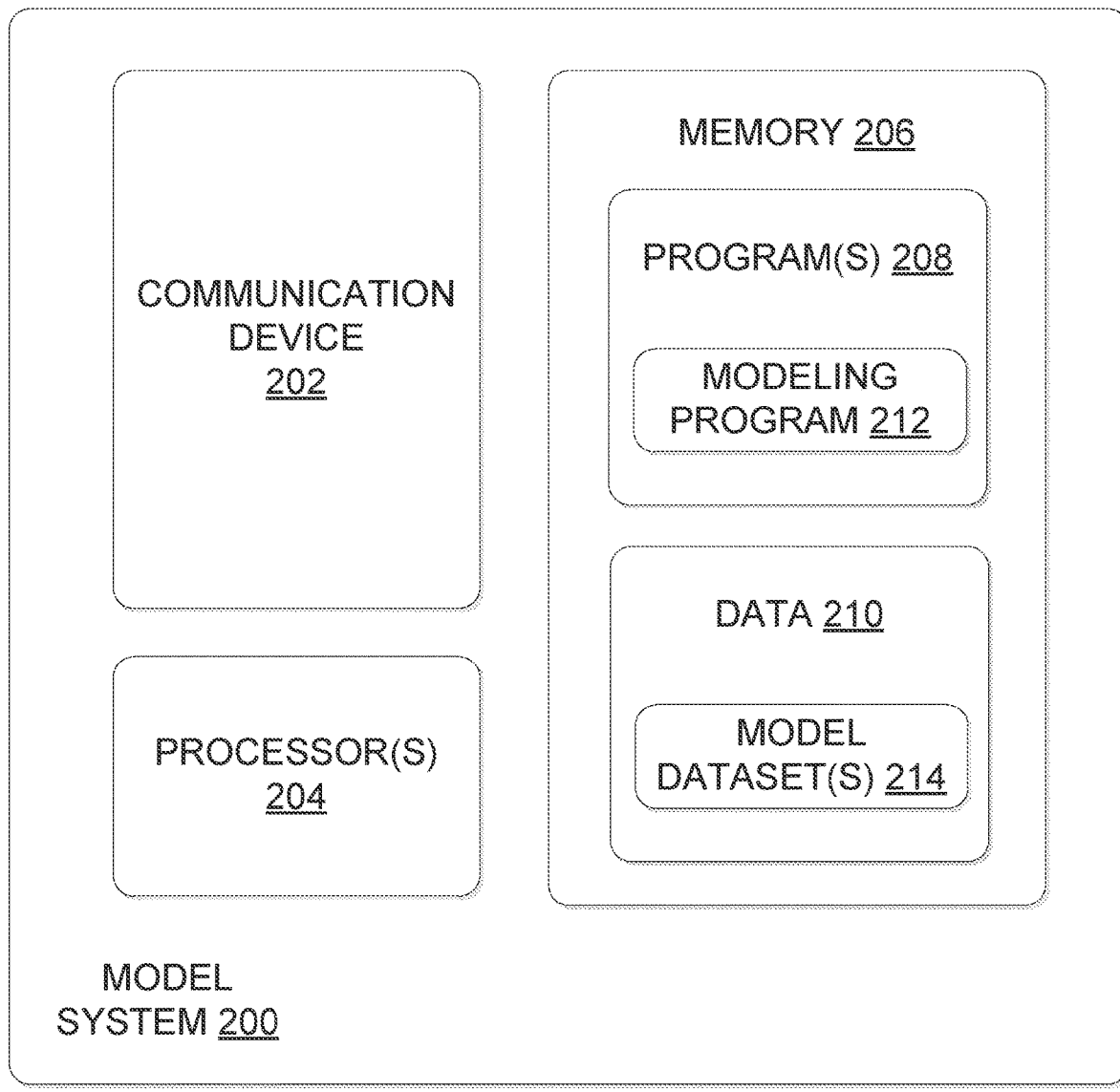
FIG. 2 is a block diagram of an exemplary modeling system, consistent with disclosed embodiments.

FIG. 2 is a block diagram of an exemplary model system 200, consistent with disclosed embodiments. As shown, model system 200 may include a communication device 202, one or more processor(s) 204, and memory 206 including one or more program(s) 208 and data 210.

Model system 200 may take the form of a server, general purpose computer, mainframe computer, or any combination of these components. Other implementations consistent with disclosed embodiments are possible as well. Model system 200 may, for example, be similar to model system 102 described above.

Communication device 202 may be configured to communicate with one or more entities. For example, in some embodiments, communication device 202 may be configured to communicate with a monitoring system and/or data storage, such as monitoring system 104 and data storage 106 described above. In some embodiments, communication device 202 may be configured to communicate with the monitoring system and/or data storage through a network, such as network 114 described above. Communication device 202 may communicate with the monitoring system and/or data storage in other manners as well.

Communication device 202 may be configured to communicate with the monitoring system to, for example, provide one or more model dataset(s) 214 to the monitoring system. In some embodiments, model system 200 may maintain the model dataset(s) in data 210, and communication device 202 may permit the monitoring system to access the model dataset(s) 214 in data 210. Alternatively or additionally, communication device 202 may be configured to communicate with the monitoring system to provide the model dataset(s) 214 to the monitoring system over a network, such as network 114 described above, or another communication channel. Still alternatively or additionally, communication device 202 may be configured to communicate with remote data storage, such as data storage 106 described above, to provide the model dataset(s) 214 to the data storage where the model dataset(s) 214 may be accessed by the monitoring device.

Communication device 202 may also be configured to communicate with other components. In general, communication device 202 may be configured to provide communication over a network, such as network 114 described above. To this end, communication device 202 may include, for example, one or more digital and/or analog devices that allow model system 200 to communicate with and/or detect other components, such as a network controller and/or wireless adaptor for communicating over the Internet. Other implementations consistent with disclosed embodiments are possible as well.

Processor(s) 204 may include one or more known processing devices, such as a microprocessor from the Core™, Pentium™ or Xeon™ family manufactured by Intel™, the Turion™ family manufactured by AMO™, the "Ax" or "Sx" family manufactured by Apple™, or any of various processors manufactured by Sun Microsystems, for example. The disclosed embodiments are not limited to any type of processor(s) otherwise configured to meet the computing demands required of different components of model system 200.

Memory 206 may include one or more storage devices configured to store instructions used by processor(s) 204 to perform functions related to disclosed embodiments. For example, memory 206 may be configured with software instructions, such as program(s) 208, that may perform one or more operations when executed by processor(s) 204. The disclosed embodiments are not limited to separate programs or computers configured to perform dedicated tasks. For example, memory 206 may include a single program 208 that performs the functions of model system 200, or program(s) 208 may comprise multiple programs. Memory 206 may also store data 210 that is used by program(s) 208. In some embodiments, for example, data 210 may include information for use in a modeling process, such as factors, modeled values, models, and/or any information associated with factors, modeled values, and/or models, such as factor risk, model risk, and/or model drift. Other data 210 is possible as well.

In certain embodiments, memory 206 may store sets of instructions for carrying out a modeling process for generating model dataset(s) 214. For example, as shown, memory 206 may include a modeling program 212 configured to generate the model dataset(s) 214 for use in a dynamic monitoring process, such as the dynamic monitoring processes described below in connection with FIGS. 4 and 6. Any number of modeling programs 212 are possible, and the disclosed dynamic monitoring processes may be performed using any modeling program that generates a model dataset 214 including modeled values for factors. Other instructions are possible as well. In general, instructions may be executed by processor(s) 204 to perform one or more processes consistent with disclosed embodiments.

The components of model system 200 may be implemented in hardware, software, or a combination of both hardware and software, as will be apparent to those skilled in the art. For example, although one or more components of model system 200 may be implemented as computer processing instructions, all or a portion of the functionality of model system 200 may be implemented instead in dedicated electronics hardware.

Figure 3:
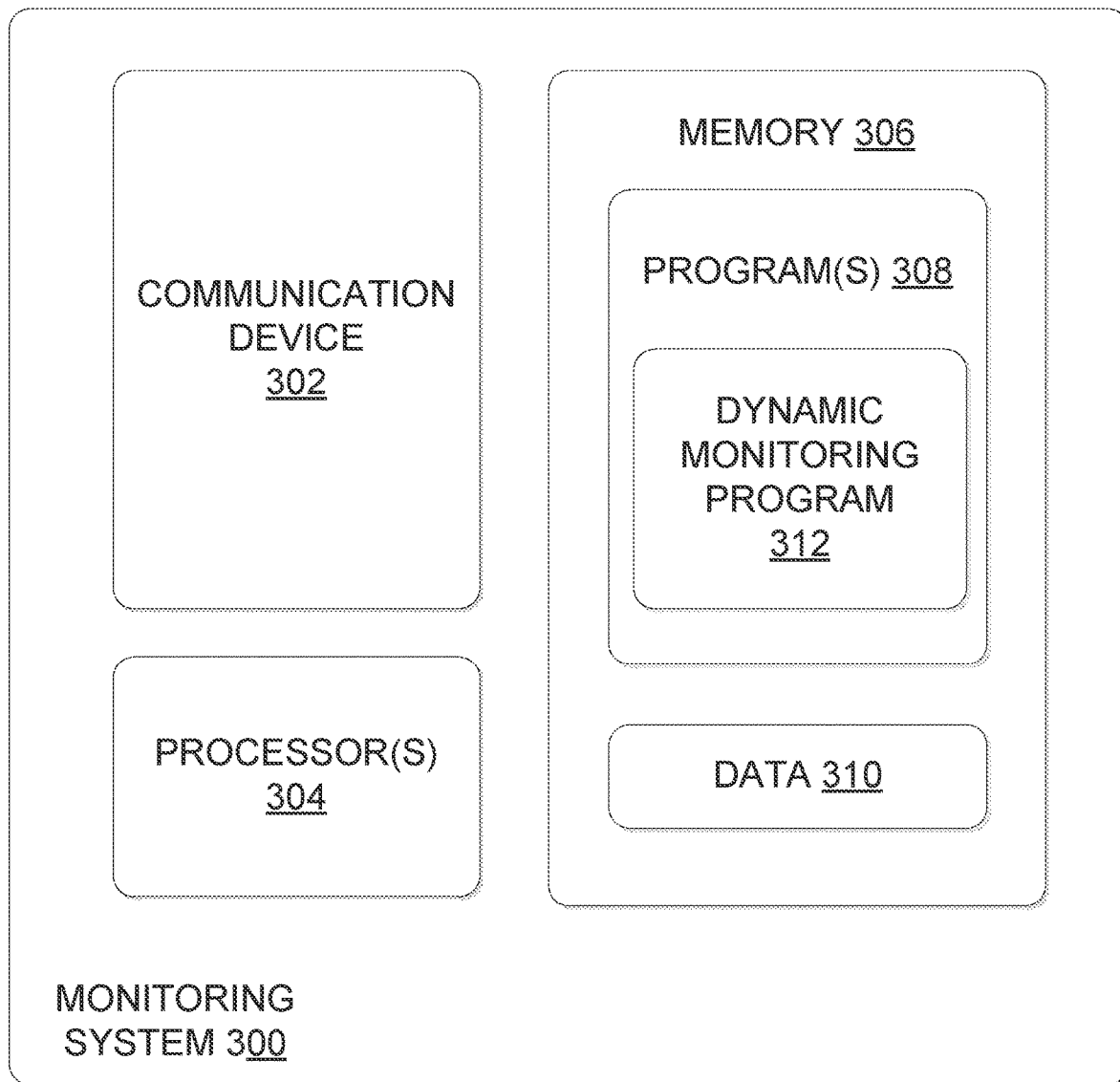
FIG. 3 is a block diagram of an exemplary monitoring system, consistent with disclosed embodiments.

FIG. 3 is a block diagram of an exemplary monitoring system 300, consistent with disclosed embodiments. As shown, monitoring system 300 may include a communication device 302, one or more processor(s) 304, and memory 306 including one or more program(s) 308 and data 310.

Monitoring system 300 may take the form of a server, general purpose computer, mainframe computer, or any combination of these components. Other implementations consistent with disclosed embodiments are possible as well. Monitoring system 300 may, for example, be similar to monitoring system 104 described above.

Communication device 302 may be configured to communicate with one or more entities. For example, in some embodiments, communication device 302 may be configured to communicate with a model system and/or data storage, such as model system 102 and data storage 106 described above. In some embodiments, communication device 302 may be configured to communicate with the model system and/or data storage through a network, such as network 114 described above. Communication device 302 may communicate with the model system and/or data storage in other manners as well.

Communication device 302 may be configured to communicate with the model system to, for example, receive one or more model dataset(s), such as model dataset(s) 112 and 214 described above. In some embodiments, the model system may maintain the model dataset(s) in local data storage at the model system, and communication device 302 may permit monitoring system 300 to access the model dataset(s) at the model system. Alternatively or additionally, communication device 302 may be configured to communicate with the model system to receive the model dataset(s) to the monitoring system over a network, such as network 114 described above, or another communication channel. Still alternatively or additionally, the model system may provide the model dataset(s) to remote data storage, such as data storage 106 described above, and communication device 302 may be configured to communicate with data storage 106 to access the model dataset(s).

Communication device 302 may also be configured to communicate with other components. In general, communication device 302 may be configured to provide communication over a network, such as network 114 described above. To this end, communication device 302 may include, for example, one or more digital and/or analog devices that allow monitoring system 300 to communicate with and/or detect other components, such as a network controller and/or wireless adaptor for communicating over the Internet. Other implementations consistent with disclosed embodiments are possible as well.

Processor(s) 304 may include one or more known processing devices, such as a microprocessor from the Core™, Pentium™ or Xeon™ family manufactured by Intel™, the Turion™ family manufactured by AMO™, the "Ax" or "Sx" family manufactured by Apple™, or any of various processors manufactured by Sun Microsystems, for example. The disclosed embodiments are not limited to any type of processor(s) otherwise configured to meet the computing demands required of different components of monitoring system 300.

Memory 306 may include one or more storage devices configured to store instructions used by processor(s) 304 to perform functions related to disclosed embodiments. For example, memory 306 may be configured with software instructions, such as program(s) 308, that may perform one or more operations when executed by processor(s) 304. The disclosed embodiments are not limited to separate programs or computers configured to perform dedicated tasks. For example, memory 306 may include a single program 308 that performs the functions of monitoring system 300, or program(s) 308 may comprise multiple programs. Memory 306 may also store data 310 that is used by program(s) 308. In some embodiments, for example, data 310 may include information for use in a dynamic monitoring process, such as factors, modeled values, models, and/or any information associated with factors, modeled values, and/or models, such as factor risk, model risk, and/or model drift. For example, data 310 may include any of the information described below in connection with dynamic monitoring processes 400 and 600. Other data 310 is possible as well.

In certain embodiments, memory 306 may store sets of instructions, such as dynamic monitoring program 312, for carrying out a dynamic monitoring process, such as the dynamic monitoring processes described below in connection with FIGS. 4 and 6. Other instructions are possible as well. In general, instructions may be executed by processor(s) 306 to perform one or more processes consistent with disclosed embodiments.

The components of monitoring system 306 may be implemented in hardware, software, or a combination of both hardware and software, as will be apparent to those skilled in the art. For example, although one or more components of monitoring system 300 may be implemented as computer processing instructions, all or a portion of the functionality of monitoring system 300 may be implemented instead in dedicated electronics hardware.

Monitoring system 300 may include more, fewer, and/or different components than those shown. For example, in some embodiments, monitoring system 300 may include and/or may be communicatively coupled to one or more display devices, such as display device 108 described above, configured to provide output and/or display graphical user interfaces, such as the graphical user interfaces described below in connection with FIGS. 5A-5C and 7A-7C. In some embodiments, such a display device may include a screen for displaying a graphical and/or text-based user interface, including but not limited to, liquid crystal displays (LCD), light emitting diode (LED) screens, organic light emitting diode (OLEO) screens, and other known display devices. As another example, in some embodiments monitoring system 200 may include and/or may be communicatively coupled to one or more digital and/or analog devices configured to receive input, such as a touch-sensitive area, keyboard, buttons, or microphones. Other components are possible as well.

Figure 4:
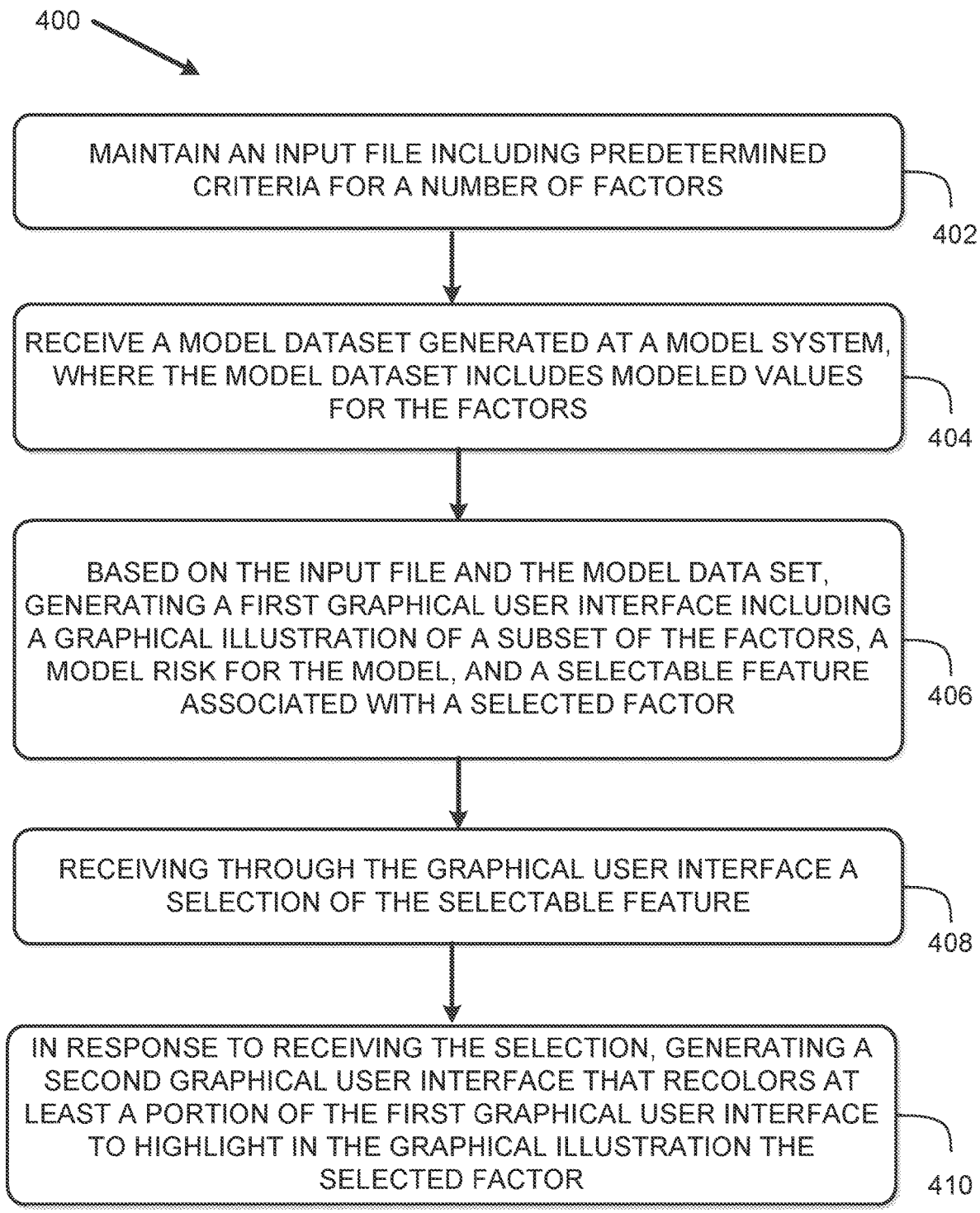
FIG. 4 is a flowchart of an exemplary dynamic monitoring process, consistent with disclosed embodiments.

FIG. 4 is a flowchart of an exemplary dynamic monitoring process 400, consistent with disclosed embodiments. Dynamic monitoring process 400 may be carried out by a monitoring system, such as monitoring systems 104 and 300 described above. FIG. 4 will be explained with reference to FIGS. 5A-5C, which illustrate exemplary graphical user interfaces in a dynamic monitoring process, consistent with disclosed embodiments.

As shown in FIG. 4, dynamic monitoring process 400 begins at step 402 with maintaining an input file including predetermined criteria for a plurality of factors. The factors and the predetermined criteria may take any of the forms described above.

In some embodiments, the factors may include any variable relevant to a model. For example, a factor may be any quantifiable value usable by a model system to generate a model. In some embodiments, the factors may vary depending on the nature of the model. For example, for a model modeling some aspect of the housing industry, the factors may include quantifiable values relevant to the housing industry, such as housing prices, interest rates, demographic information, housing volatility, foreclosures, payments, etc. As another example, for a model modeling some aspect of the automobile industry, the factors may include quantifiable values relevant to the automobile industry, such as automobile sales, automobile loan statistics, credit scores, demographics, payments, etc. Other factors and other models are possible as well.

In some embodiments, the predetermined criteria may include any criteria for evaluating a modeled value. For example, predetermined criteria may be any criteria for determining whether a modeled value contributes to model drift and/or model risk. For example, the predetermined criteria for a factor may take the form of and/or include a target value for the factor and/or a range of target values for the factor. The predetermined criteria may be used to evaluate a modeled value by, for instance, determining whether the modeled value is consistent with the target value, deviates by an acceptable amount from the target value, is within the range of target values, etc. As another example, the predetermined criteria for a factor may take the form of and/or include a historical value for the factor and/or a range of historical values for the factor. The predetermined criteria may be used to evaluate a modeled value by, for instance, determining whether the modeled value is consistent with the historical value, deviates an acceptable amount from the historical value, is within the range of historical values, etc. As still another example, the predetermined criteria for a factor may take the form of a distribution of values for the factor, and the predetermined criteria may be used to evaluate a modeled value by, for instance, determining whether the modeled value falls within the distribution. As yet another example, the predetermined criteria for a factor may take the form of one or more rules governing a relationship between the factor and the modeled value. For example, the predetermined criteria may be a rule permitting only a certain degree of deviation from a historical value over a period of time. As another example, the predetermined criteria may be a rule designed to identify an increasing deviation between the modeled value and a target value for the factor. Other predetermined criteria are possible as well.

In some embodiments, maintaining the input file may involve, for example, maintaining the input file in data storage, such as data storage 106 described above. In some embodiments, the data storage may be accessible by, for example, a remote entity in addition to the monitoring system. The remote entity may be configured to, for example, modify the input file. For instance, the remote entity may modify the input file to modify the factors and/or predetermined criteria indicated in the input file.

Dynamic monitoring process 400 continues at step 404 with receiving a model dataset generated at a model system, where the model dataset includes modeled values for the factors. The model dataset may be received from a model system, such as model systems 102 and 200 described above. In some embodiments, the monitoring system may receive the model data set via a communication device, such as communication device 302 described above.

The model dataset may take any of the forms described above for model dataset(s) 110 and 214. In general, the model dataset may be any collection of modeled values for the factors. The modeled values may be any values generated by the model for the factors. For example, a modeled value for a factor may take the form of a single value and/or a value over time. As another example, a modeled value for a factor may take the form of a distribution or other statistical calculation associated with the factor, such as a performance or a population stability index for the factor. Other modeled values are possible as well. In general, the modeled values may be independent of one another or may be interdependent. In some embodiments, the model may consider multiple factors in modeling a factor to generate a modeled value.

Dynamic monitoring process 400 continues at step 406 with generating, based on the input file and the model dataset, a first graphical user interface comprising a graphical illustration of a subset of the factors, a model risk for the model, and a selectable feature associated with a selected factor in the subset and a selected time period.

The subset of the factors may include fewer than all of the factors. In some embodiments, the monitoring system may identify the subset from the factors based on factor risks posed by the factors. For example, the monitoring system may use the predetermined criteria to ascertain a factor risk posed by each of the factors, and the monitoring system may identify for the subset factors exhibiting a relatively high factor risk. Alternatively or additionally, the monitoring system may identify the subset from the factors based on an extent to which each factor contributes to model drift and/or model risk. For example, the monitoring system may use the predetermined criteria to ascertain each factor's impact on the model drift and/or model risk, and the monitoring system may identify for the subset factors exhibiting a relatively high contribution to the model drift and/or model risk.

In some embodiments, to ascertain the factor risk and/or the contributions to model drift and/or model risks of a factor, the monitoring system may apply the predetermined criteria in the input file to the modeled values. For example, in some embodiments, the monitoring system may, for each factor, compare the modeled value for the factor to the predetermined criteria for the factor to determine a deviation of the modeled value. The deviation may be, for example, a deviation of the modeled value from a target value, a range of target values, a historical value, a range of historical values, a distribution, etc., specified by the predetermined criteria, and the monitoring system may use the deviation to assess the factor risk and/or the contribution to model drift and/or model risk of a factor. For instance, if the deviation exceeds the predetermined threshold, indicating that the modeled value deviates significantly from the predetermined criteria, the monitoring system may determine that the factor poses a relatively significant factor risk and/or is contributing relatively significantly to model drift and/or model risk. Accordingly, the monitoring system may identify the factor for the subset. On the other hand, if the deviation does not exceed the predetermined threshold, indicating that the modeled value does not deviate significantly from the predetermined criteria, the monitoring system may determine that the factor poses a relatively insignificant factor risk and/or is contributing relatively insignificantly to model drift and/or model risk. Accordingly, the monitoring system may decline to identify the factor for the subset.

Alternatively or additionally, in some embodiments the monitoring system may identify factors for the subset based on factor risk. For instance, if the determined factor risk for a factor exceeds a predetermined threshold, indicating that the factor poses a relatively significant factor risk and/or is contributing relatively significantly to model drift and/or model risk, the monitoring system may identify the factor for the subset. On the other hand, if the determined factor risk does not exceed the predetermined threshold, indicating that the factor poses a relatively insignificant factor risk and/or is contributing relatively insignificantly to model drift and/or model risk, the monitoring system may decline to identify the factor for the subset.

Figure 5A:
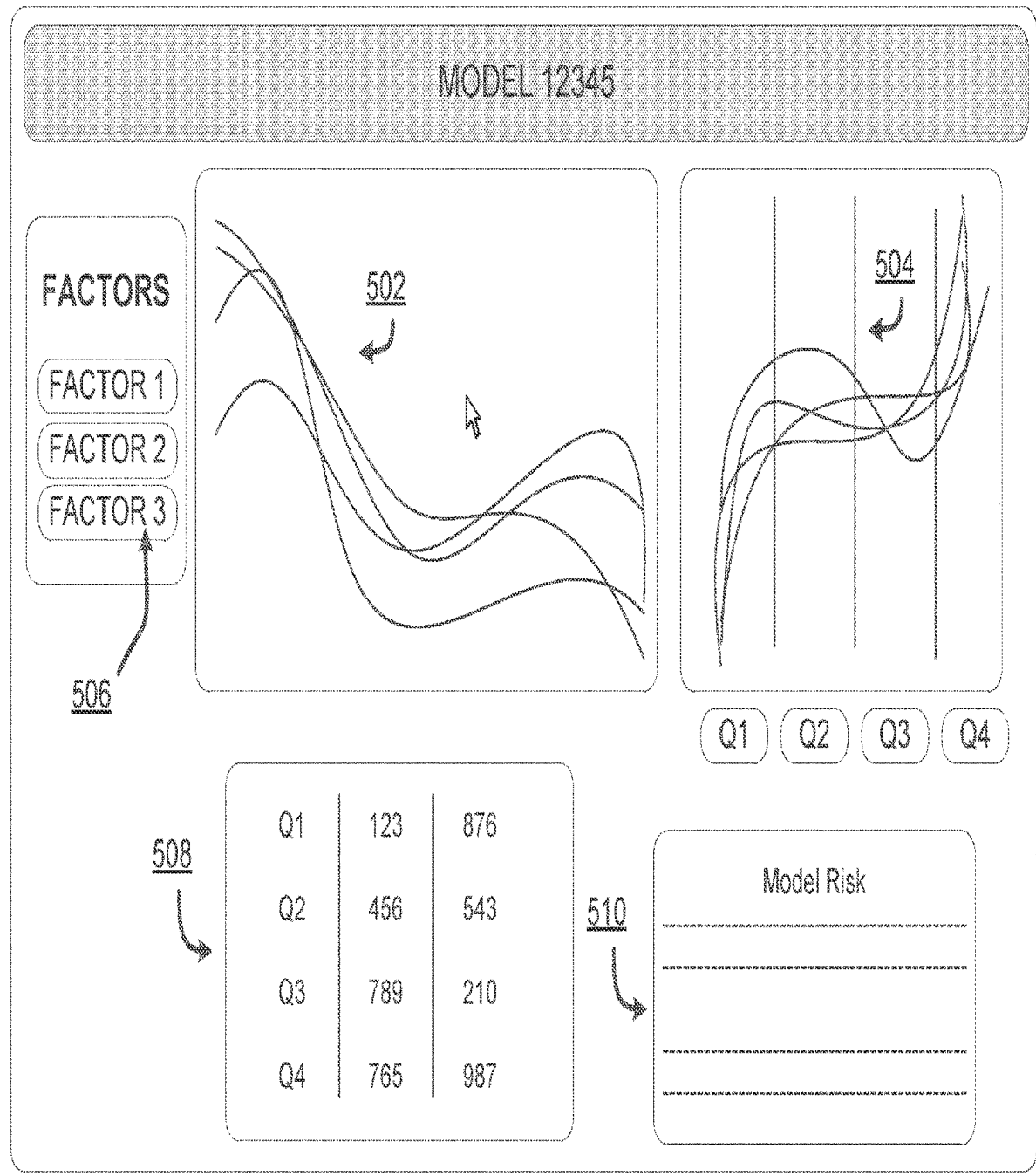
FIGS. 5A-5C illustrate exemplary graphical user interfaces in a dynamic monitoring process, consistent with disclosed embodiments.

An example first graphical user interface 500 is shown in FIG. 5A. As shown, first graphical user interface 500 may include a graphical illustration 502 of the subset of the factors. Graphical illustration 502 may take any form that graphically illustrates one or more aspects of the subset of the factors. For example, in some embodiments, graphical illustration 502 may take the form of a chart or graph illustrating quantitative values associated with the subset of the factors. For example, graphical illustration 502 may illustrate a factor risk for each factor in the subset. As another example, graphical illustration 502 may illustrate a population stability index, a distribution, performance, or other quantitative value associated with each factor in the subset of the factors. Alternatively or additionally, graphical illustration 502 may illustrate quantitative values associated with the subset of factors over one or more time periods. For example, graphical illustration 502 may illustrate a factor risk for each factor over one or more time periods. Still alternatively or additionally, in some embodiments, graphical illustration 502 may take the form of a mixed textual and graphical illustration including textual information, such as textual information identifying the factors, textual information identifying first graphical user interface 500 may include a list or other textual description including indications of each of the subset of the factors, indications of the one or more time periods, and/or other textual information. While graphical illustration 502 is shown in a single color, in some embodiments color may be used to enhance graphical illustration 502. For example, the factors illustrated in graphical illustration 502 may be color-coded to distinguish among the factors, quantitative values, time periods, textual information, etc.

In some embodiments, first graphical user interface 500 may further illustrate a model risk for the model. The model risk may be determined based on, for example, factor risks for factors in the subset, which may in turn be determined based on the modeled values and the predetermined criteria, as described above. In some embodiments, the model risk may be illustrated through a chart or graph illustrating quantitative values associated with the model risk and/or the subset of factors. For example, the model risk may be illustrated through a performance graph illustrating a performance of the model relative to other models that generate modeled values for the subset of factors. As another example, the model risk may be illustrated through a population stability index, a distribution, or other quantitative value associated with the model risk and/or factor risks for the subset of factors. Alternatively or additionally, the graphical illustration of the model risk may illustrate an extent to which each factor in the subset contributes to the model risk. Still alternatively or additionally, the graphical illustration of the model risk may illustrate a deviation of the model from reality over time. The model risk may be illustrated in other manners as well.

An example graphical illustration 504 of the model risk is shown in FIG. 5A. As shown, graphical illustration 504 takes the form of a graph that illustrates the model risk over a number of time periods, labeled "01," "02," etc. In some embodiments, each of the lines shown in graphical illustration 504 may correspond to a factor in the subset. Other example graphical illustrations of the model risk are possible as well.

In some embodiments, instead of or in addition to graphical illustration 504 of the model risk, first graphical user interface 500 may include a textual description 510 of the model risk. The textual description may include, for example, a description of the subset of factors, the factor risk for each factor in the subset of factors, the time periods, and/or an extent to which each factor in the subset contributes to the model risk. Other textual description is possible as well.

First graphical user interface 500 may further include a selectable feature 506, as shown. Selectable feature 506 may, for example, be associated with a particular factor from the input file. For example, as shown, first graphical user interface 500 may include an indication of each factor in the subset, and the selectable feature may take the form of an indication of a factor. For example, as shown, selectable feature 506 is associated with "Factor 3." In some embodiments, where first graphical user interface 500 includes indications of the factors in the subset, the factors may be ranked and/or otherwise presented according to the extent to which they contribute to the model risk, a severity of the factor risk for each factor, and/or other criteria. Alternatively or additionally, in some embodiments, selectable feature 506 may be associated with a time period, such as a time, day, or period of days. Still alternatively or additionally, in some embodiments selectable feature 506 may, upon selection, present additional options for input from a user. For example, selection of selectable feature 506 may present a user with options to, for instance, "Keep Only" the selected factor or to "Exclude" the selected factor. Such additional options may, for example, be presented as overlay to first graphical user interface 500, such as in a pop-up window. In general, selectable feature 506 may be any feature configured to be selected by a user through first graphical user interface 500.

In some embodiments, first graphical user interface 500 may include one or more additional features, such as additional feature 508. Additional features of first graphical user interface 500 may include textual descriptions and/or graphical illustrations of one or more additional aspects of the model, the model risk, the model drift, the subset of factors, the factor risk, and/or the modeled values. Any additional feature 508 may take any of the forms described above for graphical illustrations 502, 504 and textual description 510.

Returning to FIG. 4, at step 406 dynamic monitoring process 400 includes receiving through the first graphical user interface a selection of the selectable feature. For example, as shown in FIG. 5A, a user may select selectable feature 506 by providing input to graphical user interface 500. The input may take the form of, for example, a mouse click, a key stroke, or a touchscreen touch. Other inputs are possible as well.

Dynamic monitoring process 400 continues at step 408 with, in response to receiving the selection, generating a second graphical user interface, the second graphical user interface recoloring at least a portion of the first graphical user interface to highlight in the graphical illustration the selected factor.

Figure 5B:
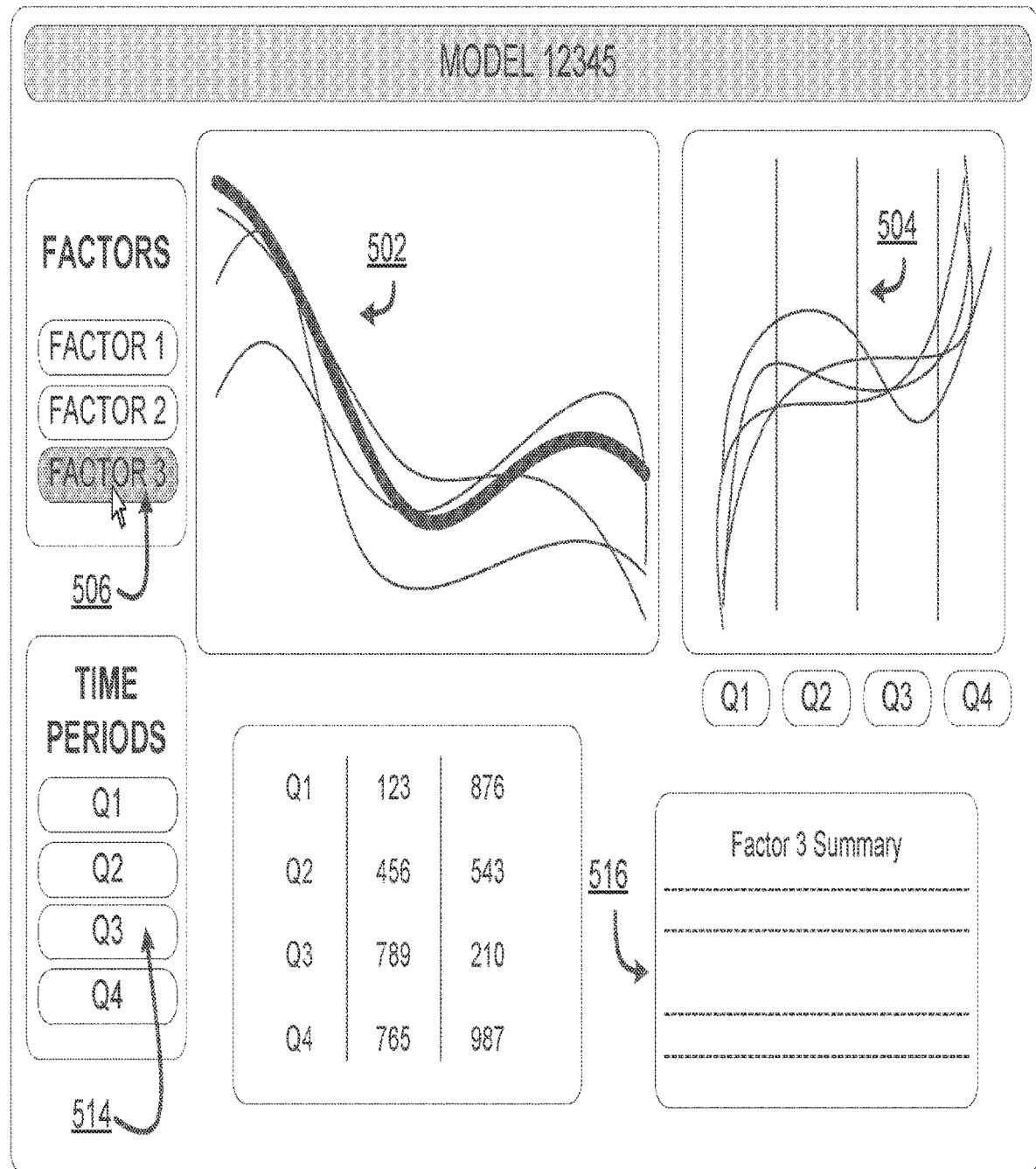

An example second graphical user interface 512 is shown in FIG. 5B. As shown, selectable feature 506 for "Factor 3" has been selected, and graphical illustration 502 of the subset of factors has been recolored to highlight, in graphical illustration 502, the selected factor, namely, "Factor 3." While the recoloring is shown as a balding of the line associated with the selected factor, it will be understood that the selected factor may be highlighted in graphical illustration 502 in other manners as well, including through the use of colors, patterns, overlays, etc.

Alternatively or additionally, in some embodiments second graphical user interface 512 may add and/or replace one or more features of first graphical user interface 500 with additional information pertaining to the selected factor. For example, as shown, second graphical user interface 512 replaces textual description 510 of the model risk with a textual description 516 pertaining to the selected factor, "Factor 3." Textual description 516 pertaining to the selected factor may include, for example, a description of the selected factor, the factor risk for the selected factor, one or more time periods associated with the selected factor, and/or an extent to which the selected factor contributes to the model risk. Other textual description is possible as well. As another example, as shown, second graphical user interface 512 may add a second selectable feature 514. The second selectable feature 514 may permit a user to view additional details associated with the selected factor. For example, as shown, the second selectable feature 514, if selected, may provide a more detailed illustration of the selected factor during the selected time period. Other selectable features are possible as well.

In general, selectable features may facilitate navigation through a series of graphical user interfaces through which a user may isolate, identify, and view illustrations of the selected factor, the factor risk for the selected factor, the model risk, the model drift, and/or an extent to which the selected factor contributes to the model risk and/or the model drift. In some embodiments, for example, second graphical user interface 512 may illustrate the deviation for the selected factor determined by comparing the modeled value for the factor to the predetermined criteria, as described above. As another example, the second graphical user interface 512 may illustrate the factor risk for the selected factor determined by comparing the modeled value for the factor to the predetermined criteria, as described above.

Figure 5C:
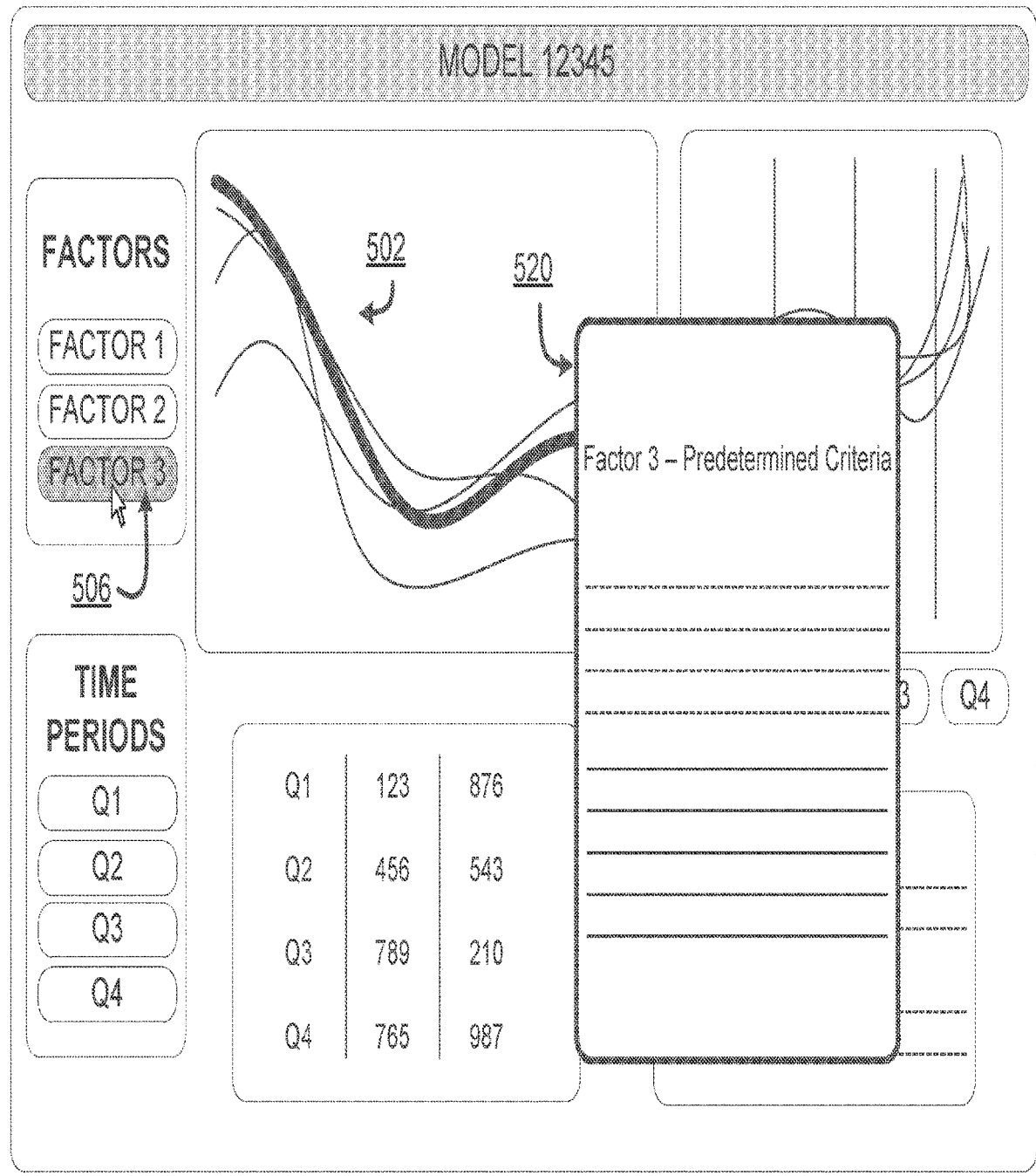

As still another example, a third graphical user interface 518, as shown in FIG. 5C, may add as an overlay to second graphical user interface 512 a description associated with the recoloring. For example, the third graphical user interface 518 may include a pop-up window 520 describing, for example, the predetermined criteria for the selected factor, the modeled value for the selected factor, the factor risk for the selected factor, and/or an extent to which the selected factor contributes to model drift and/or model risk.

Figure 6:
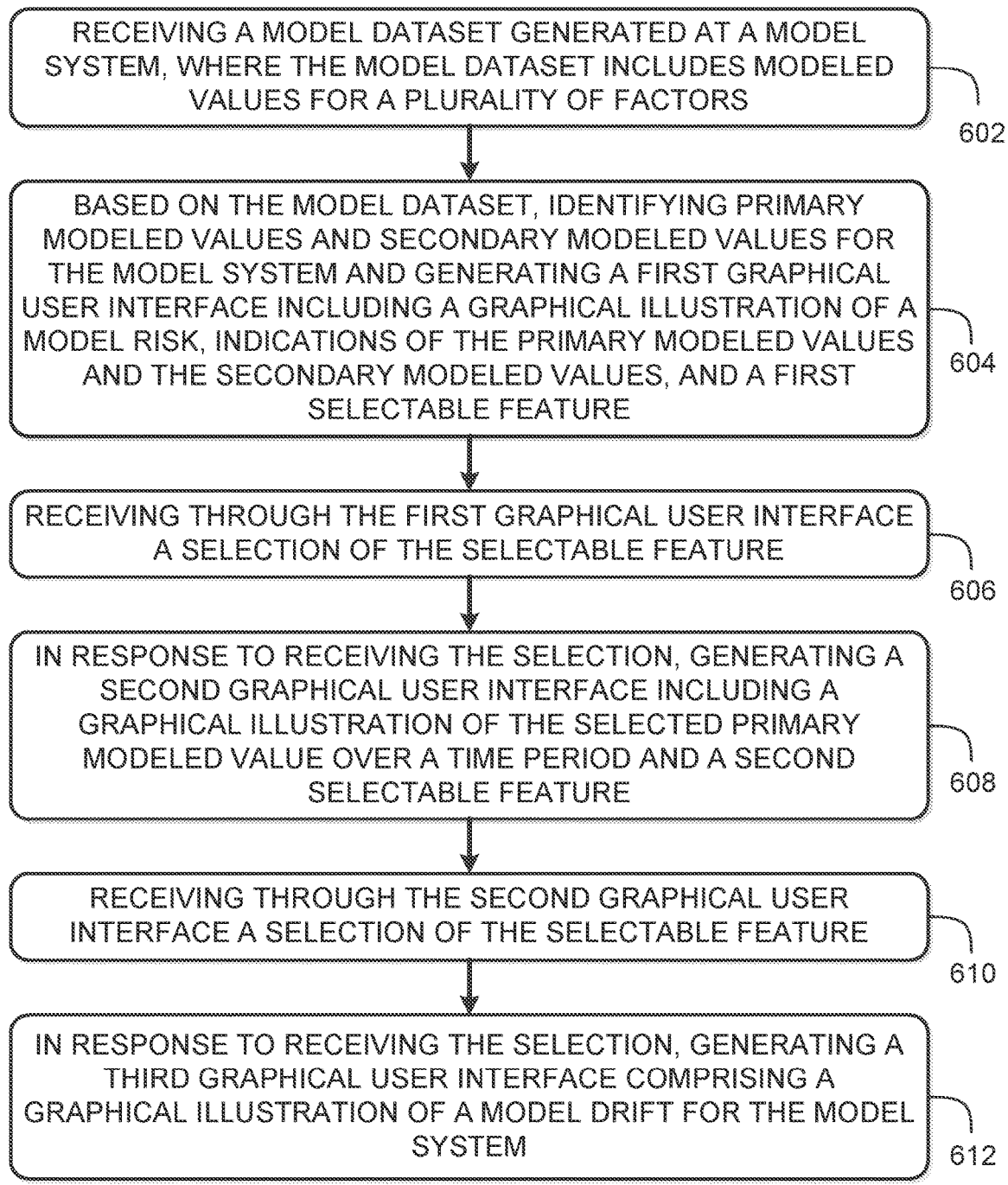
FIG. 6 is a flowchart of another exemplary dynamic monitoring process, consistent with disclosed embodiments.

FIG. 6 is a flowchart of another exemplary dynamic monitoring process 600, consistent with disclosed embodiments. Dynamic monitoring process 600 may be carried out by a monitoring system, such as monitoring systems 104 and 300 described above. FIG. 6 will be explained with reference to FIGS. 7A-5C, which illustrate exemplary graphical user interfaces in a dynamic monitoring process, consistent with disclosed embodiments.

As shown, dynamic monitoring process 600 begins at step 602 with receiving a model dataset generated for a model, where the model dataset includes modeled values for a plurality of factors. The model dataset, the modeled values, and the plurality of factors may take any of the forms described above, and the model dataset may be received in any of the manners described above.

Dynamic monitoring process 600 continues at step 604 with, based on the model dataset, identifying primary modeled values and secondary modeled values for the model and generating a first graphical user interface. The graphical user interface may include a graphical illustration of a model risk for the model, indications of the primary modeled values and the secondary modeled values, and a first selectable feature associated with a selected primary modeled value.

Figure 7A:
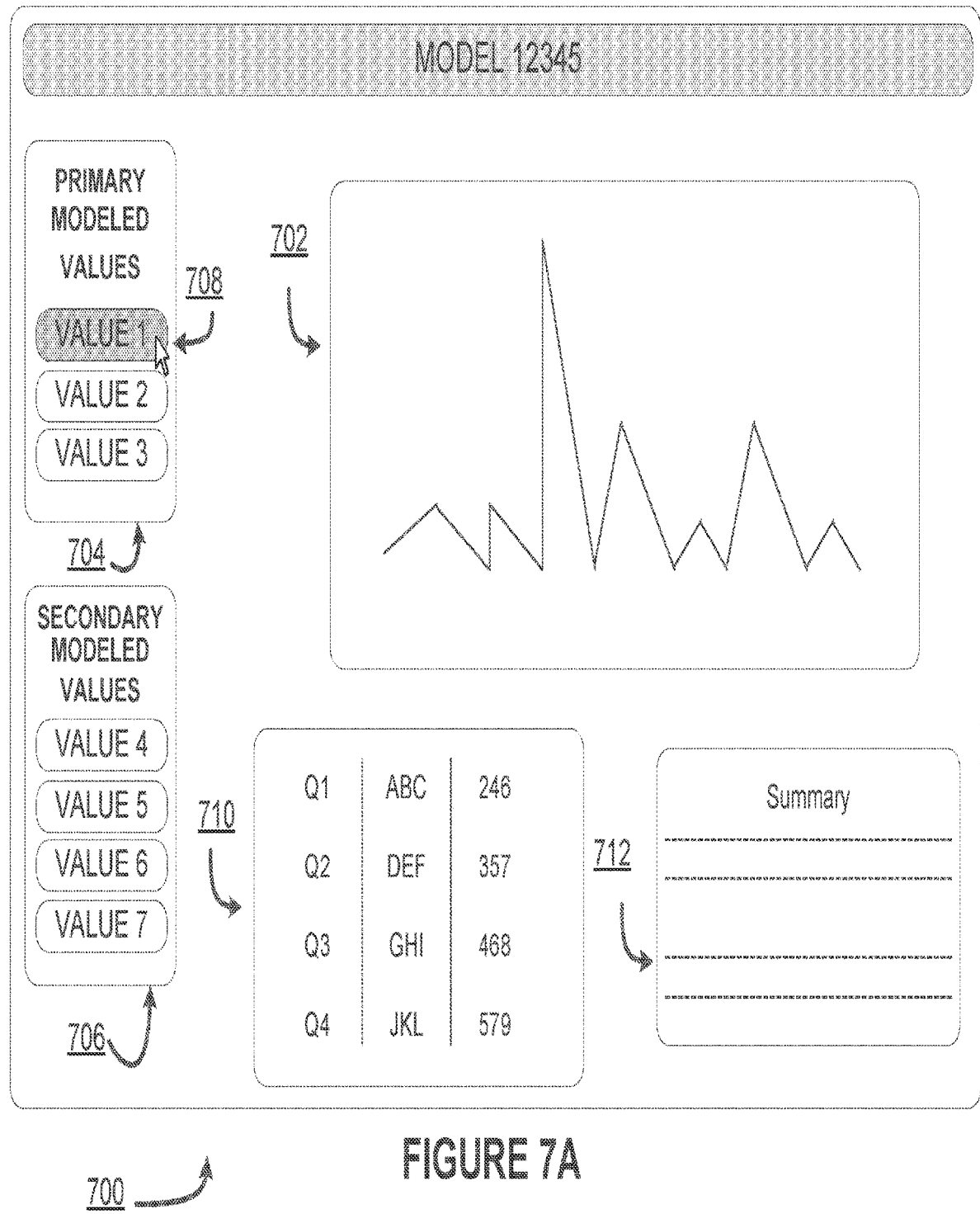
FIGS. 7A-7C illustrate exemplary graphical user interfaces in a dynamic monitoring process, consistent with disclosed embodiments.

An example first graphical user interface 700 is shown in FIG. 7A. As shown, first graphical user interface 700 may include a graphical illustration 702 of the model risk for the model. The model risk may be determined based on, for example, the factor risks for factors in the subset, which may in turn be determined based on the modeled values and the predetermined criteria, as described above. In some embodiments, the model risk may be illustrated through a chart or graph illustrating quantitative values associated with the model risk and/or the subset of factors, such as graphical illustration 702. For example, the model risk may be illustrated through a performance graph illustrating a performance of the model relative to other models that generate modeled values for the subset of factors. As another example, the model risk may be illustrated through a population stability index, a distribution, or other quantitative value associated with the model risk and/or factor risks for the subset of factors. Alternatively or additionally, the graphical illustration of the model risk may illustrate an extent to which each factor in the subset contributes to the model risk. Still alternatively or additionally, the graphical illustration of the model risk may illustrate a deviation of the model from reality over time. The model risk may be illustrated in other manners as well.

Further, as shown, first graphical user interface 700 may include an indication 704 of the primary modeled values and an indication 706 of the secondary modeled values. In some embodiments, the monitoring system may identify the primary modeled values in a manner similar to that in which the monitoring system identified the factors in the subset, as described above. For example, in some embodiments, the monitoring system may maintain an input file including predetermined criteria for the factors, as described above. For example, the input file may be maintained in data storage, such as data storage 106 described above.

The monitoring system may compare the modeled values for the factors in the model dataset to the predetermined criteria for the factors to determine a deviation, as described above. If the deviation exceeds a predetermined threshold, indicating that a modeled value deviates significantly from the predetermined criteria, the monitoring system may determine that the modeled value poses a relatively significant factor risk and/or is contributing relatively significantly to model drift and/or model risk. Accordingly, the monitoring system may identify the modeled value as a primary modeled value. On the other hand, if the deviation does not exceed the predetermined threshold, indicating that the modeled value does not deviate significantly from the predetermined criteria, the monitoring system may determine that the modeled value poses a relatively insignificant factor risk and/or is contributing relatively insignificantly to model drift and/or model risk. Accordingly, the monitoring system may identify the modeled value as a secondary modeled value.

Alternatively or additionally, in some embodiments the monitoring system may identify primary and second modeled values based on factor risk. For instance, if the determined factor risk for a modeled value exceeds a predetermined threshold, indicating that the modeled value poses a relatively significant factor risk and/or is contributing relatively significantly to model drift and/or model risk, the monitoring system may identify the modeled value as a primary modeled value. On the other hand, if the determined factor risk does not exceed the predetermined threshold, indicating that the modeled value poses a relatively insignificant factor risk and/or is contributing relatively insignificantly to model drift and/or model risk, the monitoring system may identify the modeled value as a secondary modeled value.

In some embodiments, where first graphical user interface 700 includes indications of the primary and secondary modeled values, the modeled values may be ranked and/or otherwise presented according to the extent to which they contribute to the model risk, a severity of the factor risk for each factor, and/or other criteria.

Returning to FIG. 7A, first graphical user interface 700 may further include a first selectable feature 708 associated with a selected primary modeled value, as shown. The first selectable feature 708 may take any of the forms described above. In some embodiments, the first selectable feature 708 may take the form of a request to isolate the primary modeled value. Alternatively or additionally, in some embodiments, the first selectable feature 708 may take the form of a request for a detailed view of the selected primary model. Other selectable features are possible as well.

In some embodiments, first graphical user interface 700 may further include one or more additional features, such as graphical illustration 710 and textual description 712, each of which may take any of the forms described above for features in connection with FIG. 4.

Returning to FIG. 6, at step 606 dynamic monitoring process 600 further includes receiving through the first graphical user interface a selection of the first selectable feature. The first selectable feature may be selected in any of the manners described above.

Monitoring process 600 continues at step 608 with, in response to receiving the selection of the first selectable feature, generating a second graphical user interface. The second graphical user interface may include a graphical illustration of the selected primary modeled value over a time period and a second selectable feature associated with a model drift for the model. In some embodiments, an indication of the time period may be received through the first graphical user interface 714 along with the first selectable feature 708.

Figure 7B:
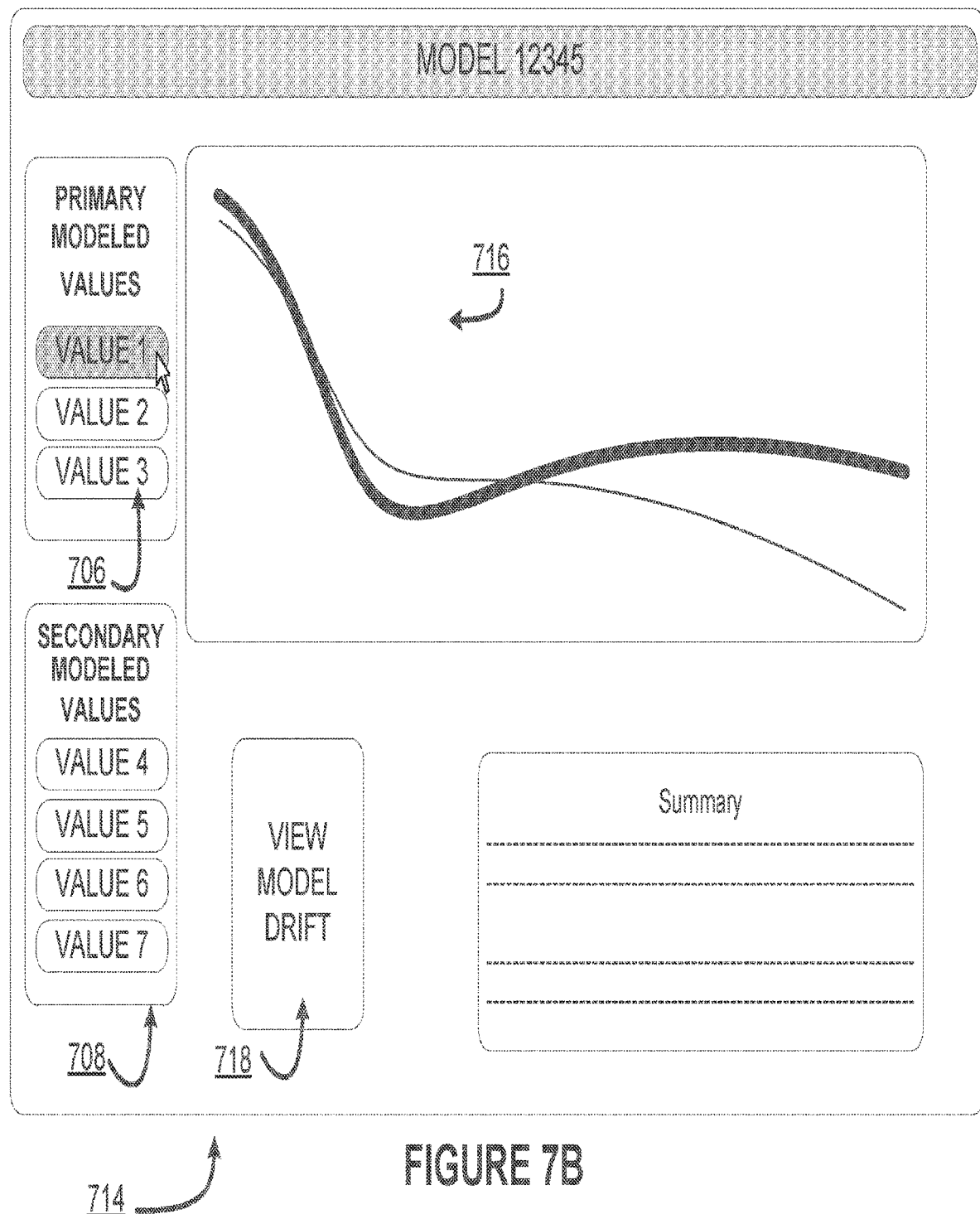

An example second graphical user interface 714 is shown in FIG. 7B. As shown, second graphical user interface 714 includes a graphical illustration 716 of the selected primary modeled value. In some embodiments, graphical illustration 716 may present, for example, a comparison of the selected primary modeled value modeled by the model with modeled values for the factor generated using other available models. Alternatively or additionally, in some embodiments graphical illustration 716 may present, for example, a comparison of the selected primary modeled value among different segments of customers. While only two lines are shown in graphical illustration 716, it will be understood that additional lines (for example, illustrating additional available models and/or additional segments of customers) are possible as well. Graphical illustration 702 may take any of the forms described above in connection with graphical illustration 502. In general, graphical illustration 702 may take any form that graphically illustrates one or more aspects of the subset of the factors. In some embodiments, in addition to graphical illustration 702, second graphical user interface 714 may include a description associated with the selected primary modeled value over the time period.

Additionally, as shown, second graphical user interface 714 may include a second selectable feature 718. The second selectable feature 718 is associated with a model drift for the model. The second selectable feature 718 may take any the forms described above.

In some embodiments, second graphical user interface 714 may include one or more additional features. For example, in some embodiments, the second graphical user interface 714 may include a graphical illustration of the deviation for the selected primary modeled value. As another example, the second graphical user interface 714 may illustrate the risk for the selected primary model.

Returning to FIG. 6, at step 610 dynamic monitoring process 600 includes receiving through the second graphical user interface a selection of the second selectable feature. The second selectable feature may be selected in any of the manners described above.

At step 612, in response to receiving the selection of the second selectable feature, the monitoring system may generate a third graphical user interface. The third graphical user interface may include a graphical illustration of the model drift. For example, the graphical illustration of the model drift may illustrate an extent to which the selected primary modeled value contributes to the model drift relative to at least one other primary modeled value.

In some embodiments, monitoring system may maintain an input file, as described above, and may determine the model drift associated with the selected primary modeled value based on the input file. For example, monitoring system may identify, based on the input file, a factor corresponding to the selected primary modeled value. Further, monitoring system may identify, based on the input file, predetermined criteria for the identified factor. Monitoring system may compare the selected primary modeled value to the predetermined criteria for the factor to determine a deviation for the selected primary modeled value, as described above. Based on the determined deviation, monitoring system may determine the model drift.

Alternatively or additionally, monitoring system may determine the model drift for the model generally, rather than only as associated with the selected primary modeled value. For example, monitoring system may compare each factor to the predetermined criteria for the factor to determine a deviation. Monitoring system may identify, based on the input file, a factor corresponding to the selected primary modeled value. Monitoring system may further identify, based on the input file, predetermined criteria for the identified factor and determine the model drift for the model based on the determined deviations.

Still alternatively or additionally, monitoring system may determine the model risk based on the primary modeled values and the predetermined criteria for the primary modeled values. Monitoring system may determine the model risk in any of the manners described above.

Figure 7C:
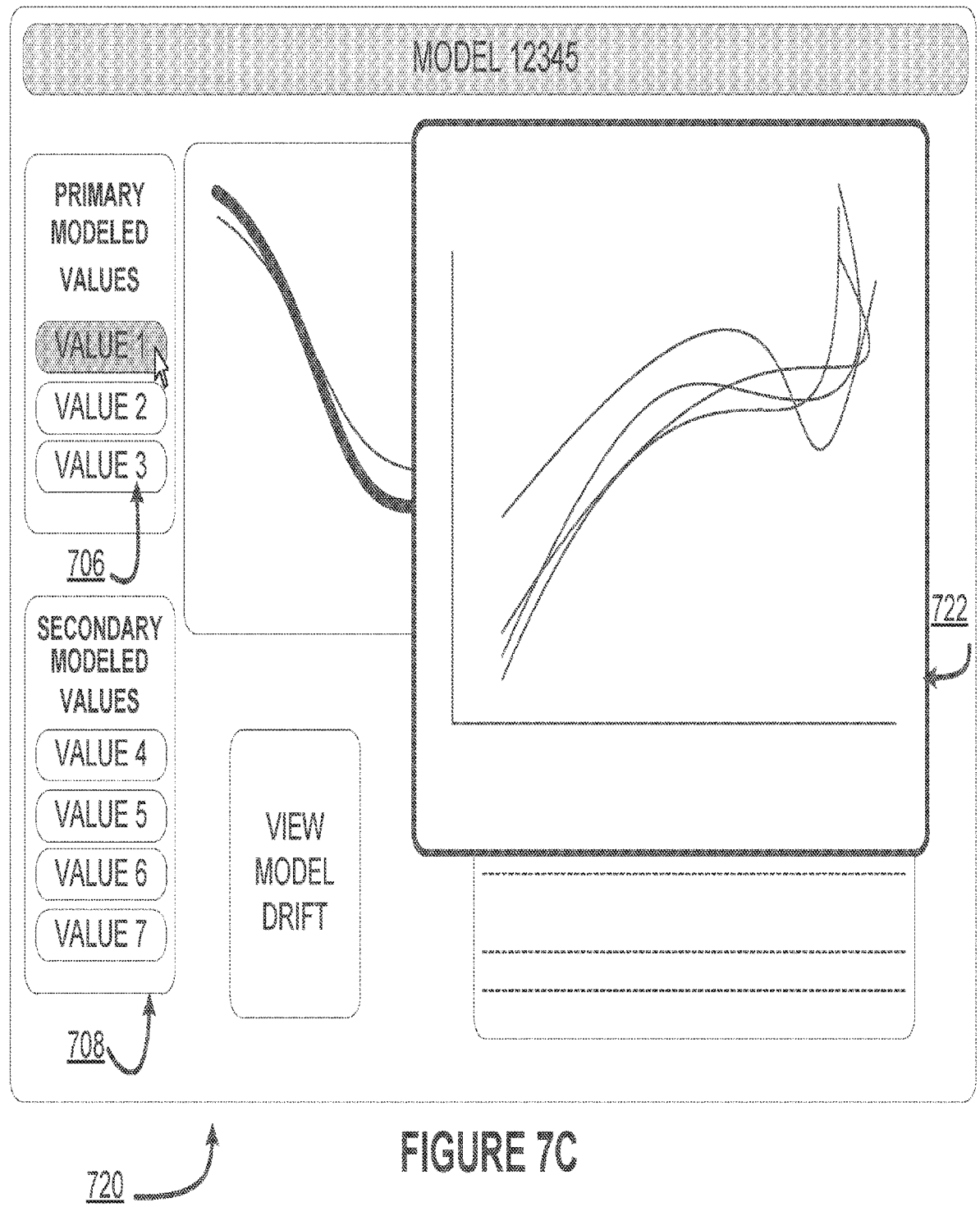

FIG. 7C illustrates an example third graphical user interface 720. As shown, third graphical user interface 720 overlays second graphical user interface 714 with a graphical illustration 722 of the model drift. The second graphical illustration 722 of the model drift may, for example, illustrate an extent to which the selected primary modeled value contributes to the model drift relative to one or more other primary modeled values. Alternatively or additionally, second graphical illustration 722 may take any of the forms described above in connection with the graphical illustrations of the model risk. It will be understood that the graphical user interfaces described above, including their contents, are merely illustrative and are not meant to be limiting. That is, other graphical user interfaces, including their contents, are possible as well.

In some examples, some or all of the logic for the above-described techniques may be implemented as a computer program or application or as a plug-in module or subcomponent of another application. The described techniques may be varied and are not limited to the examples or descriptions provided.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments. For example, while a financial service provider and merchant have been referred to herein for ease of discussion, it is to be understood that consistent with disclosed embodiments other entities may provide such services in conjunction with or separate from a financial service provider and merchant.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

Furthermore, although aspects of the disclosed embodiments are described as being associated with data stored in memory and other tangible computer-readable storage mediums, one skilled in the art will appreciate that these aspects may also be stored on and executed from many types of tangible computer-readable media, such as secondary storage devices, like hard disks, floppy disks, or CD-ROM, or other forms of RAM or ROM. Accordingly, the disclosed embodiments are not limited to the above described examples, but instead is defined by the appended claims in light of their full scope of equivalents.

What is claimed is:

1. A system comprising:
   one or more processors and non-transitory media storing instructions that, when executed by the one or more processors, cause operation comprising:
   receiving a plurality of modeled values for a plurality of factors;
   generating a first graphical user interface comprising a first selectable feature, a first graphical representation related to model drift, and indications of a subset of modeled values of the plurality of modeled values;
   receiving, via the first graphical user interface, a first selection of the first selectable feature, the first selectable feature associated with a first modeled value of the subset of modeled values;
   generating, based on the first selection, a second graphical user interface comprising a second graphical representation of the first modeled value associated with the first selectable feature over a time period;
   determining a deviation of the first modeled value based on one or more predetermined criteria for a first factor of the first modeled value;
   identifying, based on whether the deviation exceeds a predetermined threshold, the first modeled value as having a first level of impact on the model drift; and
   presenting, on the second graphical user interface, a third graphical representation of an extent to which the first modeled value associated with the first selectable feature contributes to the model drift.

2. The system of claim 1,
   wherein identifying the first modeled value as having the first level of impact on the model drift comprises determining that the deviation exceeds the predetermined threshold, and
   wherein presenting the third graphical representation comprises presenting, based on the determination that the deviation exceeds the predetermined threshold, the third graphical representation of the extent to which the first modeled value associated with the first selectable feature contributes to the model drift.

3. The system of claim 1, the operations further comprising:
   determining that the deviation exceeds the predetermined threshold,
   wherein identifying the first modeled value as having the first level of impact on the model drift comprises identifying the first modeled value as being a primary modeled value in lieu of being a secondary modeled value based on the determination that the deviation exceeds the predetermined threshold.

4. The system of claim 1, the operations further comprising:
determining that the deviation does not exceed the predetermined threshold,
wherein identifying the first modeled value as having the first level of impact on the model drift comprises identifying the first modeled value as being a secondary modeled value in lieu of being a primary modeled value based on the determination that the deviation does not exceed the predetermined threshold.

5. A method comprising:
receiving a plurality of modeled values for a plurality of factors;
generating a first graphical user interface comprising a first selectable feature, a first graphical representation related to model drift, and indications of a subset of modeled values of the plurality of modeled values;
receiving, via the first graphical user interface, a first selection of the first selectable feature, the first selectable feature associated with a first modeled value of the subset of modeled values;
generating, based on the first selection, a second graphical user interface comprising a second graphical representation of the first modeled value associated with the first selectable feature over a time period;
determining a deviation of the first modeled value based on one or more predetermined criteria for a first factor of the first modeled value;
identifying, based on whether the deviation exceeds a predetermined threshold, the first modeled value as having a first level of impact on the model drift; and
causing, in connection with the second graphical user interface, presentation of a third graphical representation of an extent to which the first modeled value associated with the first selectable feature contributes to the model drift.

6. The method of claim 5,
wherein identifying the first modeled value as having the first level of impact on the model drift comprises determining that the deviation exceeds the predetermined threshold, and
wherein causing the presentation of the third graphical representation comprises causing, based on the determination that the deviation exceeds the predetermined threshold, the presentation of the third graphical representation of the extent to which the first modeled value associated with the first selectable feature contributes to the model drift.

7. The method of claim 5, further comprising:
determining that the deviation exceeds the predetermined threshold,
wherein identifying the first modeled value as having the first level of impact on the model drift comprises identifying the first modeled value as being a primary modeled value in lieu of being a secondary modeled value based on the determination that the deviation exceeds the predetermined threshold.

8. The method of claim 5, further comprising:
determining that the deviation does not exceed the predetermined threshold,
wherein identifying the first modeled value as having the first level of impact on the model drift comprises identifying the first modeled value as being a secondary modeled value in lieu of being a primary modeled value based on the determination that the deviation does not exceed the predetermined threshold.

9. The method of claim 5, further comprising determining the model drift based on deviations of each modeled value of the plurality of modeled values for each factor of the plurality of factors from a set of predetermined criteria for the factor.

10. The method of claim 5, wherein causing the presentation of the third graphical representation comprises overlaying, on the second user interface, the third graphical representation of the extent to which the first modeled value associated with the first selectable feature contributes to the model drift.

11. The method of claim 5, wherein presenting the third graphical representation comprises presenting a pop-up window describing predetermined criteria for a corresponding factor for the first modeled value.

12. The method of claim 5, wherein the first modeled value is a primary modeled value, and wherein the extent to which the first modeled value contributes to the model drift is determined relative to one or more other primary modeled values.

13. One or more non-transitory computer-readable media storing instructions that, when executed by one or more processors, cause operations comprising:
receiving a plurality of modeled values for a plurality of factors;
generating a first graphical user interface comprising a first selectable feature, a first graphical representation related to model drift, and indications of a subset of modeled values of the plurality of modeled values;
receiving, via the first graphical user interface, a first selection of the first selectable feature, the first selectable feature associated with a first modeled value of the subset of modeled values;
generating, based on the first selection, a second graphical user interface comprising a second graphical representation of the first modeled value associated with the first selectable feature over a time period;
determining a deviation of the first modeled value based on one or more predetermined criteria for a first factor of the first modeled value;
identifying, based on whether the deviation exceeds a predetermined threshold, the first modeled value as having a first level of impact on the model drift; and
causing, in connection with the second graphical user interface, presentation of a third graphical representation of an extent to which the first modeled value associated with the first selectable feature contributes to the model drift.

14. The one or more non-transitory computer-readable media of claim 13,
wherein identifying the first modeled value as having the first level of impact on the model drift comprises determining that the deviation exceeds the predetermined threshold, and
wherein causing the presentation of the third graphical representation comprises causing, based on the determination that the deviation exceeds the predetermined threshold, the presentation of the third graphical representation of the extent to which the first modeled value associated with the first selectable feature contributes to the model drift.

15. The one or more non-transitory computer-readable media of claim 13, the operations further comprising:
determining that the deviation exceeds the predetermined threshold, wherein identifying the first modeled value as having the first level of impact on the model drift comprises identifying the first modeled value as being a primary modeled value in lieu of being a secondary modeled value based on the determination that the deviation exceeds the predetermined threshold.

16. The one or more non-transitory computer-readable media of claim 13, the operations further comprising:
determining that the deviation does not exceed the predetermined threshold,
wherein identifying the first modeled value as having the first level of impact on the model drift comprises identifying the first modeled value as being a secondary modeled value in lieu of being a primary modeled value based on the determination that the deviation does not exceed the predetermined threshold.

17. The one or more non-transitory computer-readable media of claim 13, the operations further comprising determining the model drift based on deviations of each modeled value of the plurality of modeled values for each factor of the plurality of factors from a set of predetermined criteria for the factor.

18. The one or more non-transitory computer-readable media of claim 13, wherein causing the presentation of the third graphical representation comprises overlaying, on the second user interface, the third graphical representation of the extent to which the first modeled value associated with the first selectable feature contributes to the model drift.

19. The one or more non-transitory computer-readable media of claim 13, wherein presenting the third graphical representation comprises presenting a pop-up window describing predetermined criteria for a corresponding factor for the first modeled value.

20. The one or more non-transitory computer-readable media of claim 13, wherein the first modeled value is a primary modeled value, and wherein the extent to which the first modeled value contributes to the model drift is determined relative to one or more other primary modeled values.

* * * * *